United States Patent
Han

(10) Patent No.: US 6,624,852 B1
(45) Date of Patent: Sep. 23, 2003

(54) SYNC SIGNAL CORRECTING APPARATUS FOR DTV RECEIVER

(75) Inventor: Dong Il Han, Seoul (KR)

(73) Assignee: LG Electronics Inc., Seoul (KR)

( * ) Notice: Subject to any disclaimer, the term of this patent is extended or adjusted under 35 U.S.C. 154(b) by 294 days.

(21) Appl. No.: 09/662,885

(22) Filed: Sep. 15, 2000

(30) Foreign Application Priority Data

Sep. 17, 1999 (KR) .............................................. 99-40214

(51) Int. Cl.[7] .................................................. H04L 7/00
(52) U.S. Cl. ....................................... 348/537; 348/547
(58) Field of Search ................................. 348/537, 547, 348/540, 542, 543, 544; 331/20

(56) References Cited

U.S. PATENT DOCUMENTS

| | | | |
|---|---|---|---|
| 5,528,317 A | * | 6/1996 | Gove et al. .................. 348/743 |
| 5,602,920 A | * | 2/1997 | Bestler et al. ................. 380/49 |
| 5,805,231 A | * | 9/1998 | Mogi et al. .................. 348/523 |
| 6,345,079 B1 | * | 2/2002 | Ohishi .......................... 375/373 |

* cited by examiner

*Primary Examiner*—Victor R. Kostak
(74) *Attorney, Agent, or Firm*—Birch, Stewart, Kolasch & Birch, LLP

(57) ABSTRACT

A synchronization signal correcting apparatus and method for a digital TV is disclosed. The present invention allows an output of a stable analog image in a digital TV by compensating for the difference between an input sync and a display sync that may be generated during a digital processing of an input analog image signal. Essentially, a sync signal correcting apparatus includes an image processing unit, a sync control signal generating unit for generating a sync control signal to lock a display sync of an image signal from the image processing unit with a sync of an input image signal; and a sync signal correcting unit for correcting a sync signal of the image processing unit in accordance with the sync control signal from the sync control signal generating unit. Thus, an output image signal is synchronized with the input image signal.

17 Claims, 3 Drawing Sheets

SYNC SIGNAL CORRECTING APPARATUS FOR DTV RECEIVER

BACKGROUND OF THE INVENTION

1. Field of the Invention

The present invention relates to a digital television receiver, and more particularly to a synchronization signal correcting apparatus for a digital TV.

2. Description of the Related Art

The introduction of a digital TV has allowed users to view images with a better picture quality. However, it is still necessary to view analog images using a digital TV. In comparison to a digital TV, an analog TV has imperfect signal characteristics and generates a large amount of errors in an image signal while converting from a mechanical signal such as in a video cassette recorder (VCR) into an electric image signal.

Accordingly, a time base correction has been proposed and used as a method to obtain a more stable image signal in a digital TV. However, while the time base correction of a digital TV can stabilizes an image signal, it cannot correct the synchronization (sync) of the input image. As a result, the time base correction allows an output of a stable image in space, but still an imperfect image in time during an output of a NTSC image.

SUMMARY OF THE INVENTION

Accordingly, an object of the present invention is to solve at least the problems and disadvantages of the related art.

An object of the present invention is to provide a more efficient digital TV.

Another object of the present invention is to provide a sync signal correcting apparatus in a digital TV which can compensate a difference between an input sync and a display sync that may be generated during a digital processing of an input analog image signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, a sync signal correcting apparatus in a digital TV comprises a sync control signal generating unit for generating a sync control signal to lock a display sync of an image signal output from an image processing unit with a sync of an input image signal; and a sync signal correcting unit for correcting a sync signal of the image processing unit in accordance with the sync control signal generated from the sync control signal generating unit so that the output image signal to be displayed is synchronized with the input image signal.

In the above embodiment, the sync control signal generating unit is a NTSC pulse width modulation (PWM) generating unit. Also, the sync signal correcting unit may include a low pass filter (LPF) for low-pass-filtering the sync control signal generated from the sync control signal generating unit and outputting an analog level signal; a voltage controlled crystal oscillator (VCXO) for outputting a reference clock by varying an output frequency corresponding to the analog level signal low-pass-filtered through the LPF; and a phase locked loop (PLL) for generating a correction signal to compensate the sync of the output image signal to coincide with the sync of the input image signal in accordance with the reference clock varied by the VCXO.

In another embodiment of the present invention, a sync signal correcting apparatus in a digital TV comprises a NTSC PWM generating unit for generating a PWM signal to lock a NTSC signal in accordance with both a display sync output from an image processing unit and a NTSC field sync or vertical sync of an input NTSC image; a LPF for low-pass-filtering the NTSC PWM signal generated from the NTSC PWM generating unit and outputting an analog level signal; a VCXO for outputting a reference clock by varying an output frequency corresponding to the analog level signal low-pass-filtered through the LPF; and a PLL for generating a display clock to compensate a sync of an output image signal to coincide with a sync of an input image signal in accordance with the reference clock varied by the VCXO.

In still another embodiment of the present invention, a sync signal correcting apparatus in a digital TV comprises a NTSC PWM generating unit for generating a PWM signal to lock a NTSC signal in accordance with both a display sync output from an image processing unit and a NTSC field sync or vertical sync of an input NTSC image; a system time clock generating unit for generating a system time clock (STC) by feeding back a reference clock; a digital television (DTV) PWM generating unit for generating a PWM signal to lock a DTV signal in accordance with the STC and a program clock reference (PCR) signal input through a bit stream; a multiplexer (MUX) for selecting either the PWM signal generated from the NTSC PWM generating unit or the DTV PWM generating unit; a LPF for low-pass-filtering the PWM signal selected by the MUX and outputting an analog level signal; a VCXO for outputting a reference clock by varying its output frequency corresponding to the analog level signal low-pass-filtered through the LPF; and a PLL for generating a display clock to compensate a sync of an output image signal to coincide with a sync of an input image signal in accordance with the reference clock varied by the VCXO.

In still another embodiment of the present invention, a sync signal correcting apparatus in a digital TV comprises a NTSC PWM generating unit for generating a PWM signal to lock a NTSC signal in accordance with both a display sync output from an image processing unit and a NTSC field sync or vertical sync of an input NTSC image; a system time clock generating unit for generating a STC by feeding back a reference clock; a DTV PWM generating unit for generating a PWM signal to lock a DTV signal in accordance with the STC and a PCR signal input through a bit stream; a MUX for selecting either the PWM signal generated from the NTSC PWM generating unit or the DTV PWM generating unit according to a display mode signal; a LPF for low-pass-filtering the PWM signal selected by the MUX and outputting an analog level signal; a VCXO for outputting a reference clock by varying its output frequency corresponding to the analog level signal low-pass-filtered through the LPF; a PLL for generating a display clock to compensate a sync of an output image signal to coincide with a sync of an input image signal in accordance with the reference clock varied by the VCXO; a memory for storing the NTSC image and a clock input through the NTSC image, and a PLL or dividing unit for phase-matching or dividing the reference clock varied by the VCXO with or into a NTSC output clock.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENTS

Reference will now be made in detail to the preferred embodiments of the present invention, examples of which are illustrated in the accompanying drawings. Generally, the present invention compensates the difference between an input sync and a display sync which may be generated during a digital processing of an input analog image signal, thereby outputting a stable analog image.

Figure 1:
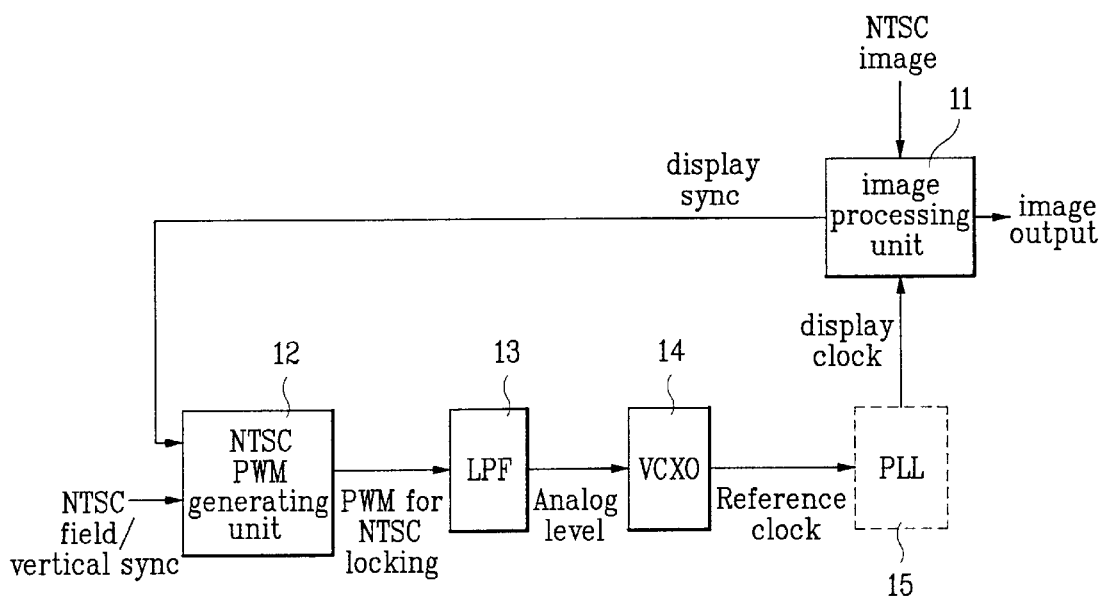
FIG. 1 is a block diagram of a sync signal correcting apparatus in a digital TV according to the present invention.

FIG. 1 is a block diagram of a sync signal correcting apparatus in a digital TV according to the present invention, comprising an image processing unit 11 which processes and outputs an input NTSC image according to a display clock, and outputs a display sync according to the display clock; a NTSC PWM generating unit 12 which generates a PWM signal to lock a NTSC signal in accordance with both a display sync output from the image processing unit 11 and a NTSC field sync or vertical sync of the input NTSC image; a LPF 13 which low-pass-filters the NTSC PWM signal from the NTSC PWM generating unit 12 and outputs an analog level signal; a VCXO 14 which outputs a reference clock by varying an output frequency corresponding to the analog level signal low-pass-filtered through the LPF 13; and a PLL 15 which generates a display clock to compensate a sync of an output image signal to coincide with a sync of an input image signal, in accordance with the reference clock varied by the VCXO 14.

The operation of the above sync signal correcting apparatus in a digital TV will next be explained with reference to the accompanying drawings.

Referring to FIG. 1, the image processing unit 11 processes the NTSC image which is input when a digital TV mode is set to a NTSC display mode. The image processing unit 11 then outputs an image according to a display clock and outputs a display sync according to the display clock. At this time, the PLL 15 provides a display clock according to a default reference clock to the image processing unit 11.

Thereafter, the NTSC PWM generating unit 12 generates a PWM signal to lock a NTSC signal in accordance with both the display sync output from the image processing unit 11 and a NTSC field sync or vertical sync of the NTSC image. Particularly, if the period of the display sync from the image processing unit 11 is relatively equal to the period of the NTSC field/vertical sync of the NTSC image, the NTSC PWM generating unit 12 outputs the NTSC PWM signal with an unmodified duty factor to lock the NTSC input signal.

However, if the period of the display sync is shorter than the period of the NTSC field/vertical sync, the NTSC PWM generating unit 12 outputs a NTSC PWM signal with a smaller duty factor than a current duty factor to lock the NTSC signal. On the other hand, if the period of the display sync is longer than the period of the NTSC field/vertical sync, the NTSC PWM generating unit 12 outputs a NTSC PWM signal with a larger duty factor than a current duty factor to lock the NTSC signal. Here, the smaller duty factor may be 50% smaller and the larger duty factor may be 50% larger.

Accordingly, the LPF 13 low-pass-filters the NTSC PWM signal from the NTSC PWM generating unit 12 and outputs an analog level signal. The VCXO 14 then outputs a reference clock by varying the output frequency to correspond to the analog level signal, low-pass-filtered by the LPF 13. Here, the VCXO 14 has a frequency variation range of about −500 ppm∼+500 ppm, centering around the reference frequency, to lock the display sync with the input NTSC field/vertical sync.

Thus, the PLL 15 generates and outputs to the image processing unit 11 the display clock to compensate the sync of the output image signal to coincide with the sync of the input signal, in accordance with the reference clock varied by the VCXO 14.

Particularly, the PLL 15 generates the display clock in units of a frame or a field such that an image jitter due to a frequency variation of the clock can be prevented. Also, if or when the sync/frequency of the output image signal coincides with the sync/frequency of the input image signal, the VCXO 14 directly outputs the output reference clock, without further processing, to the image processing unit as the display clock, thereby skipping the PLL 15.

As a result, the image processing unit 11 outputs the processed NTSC image according to the display clock output from the PLL 15 or the VCXO 14, respectively, such that the output NTSC image can be synchronized with the input NTSC image.

Figure 2:
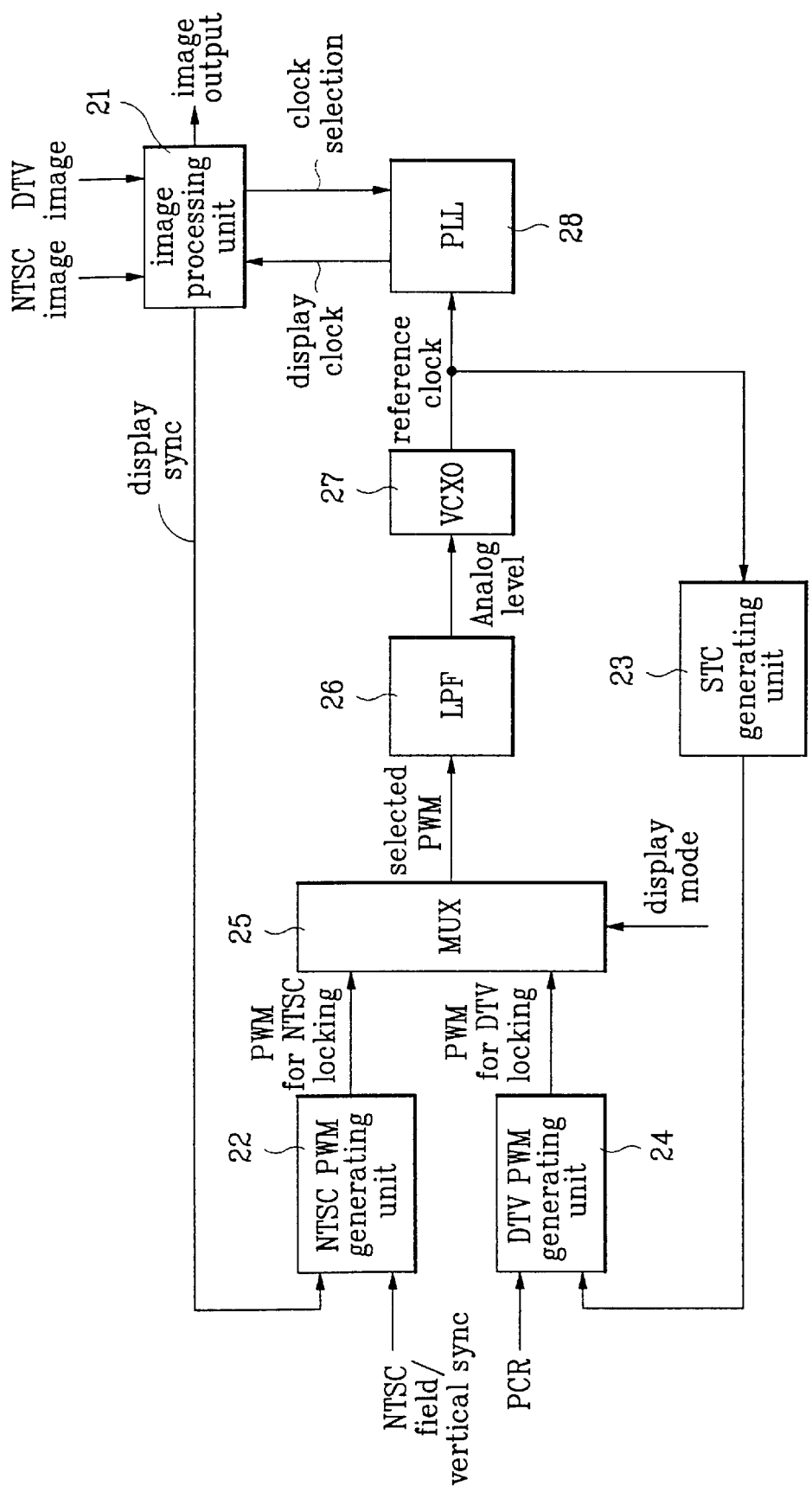
FIG. 2 is a block diagram of a sync signal correcting apparatus in a digital TV according to another embodiment of the present invention.

FIG. 2 is also a block diagram of a sync signal correcting apparatus in a digital TV according to another embodiment of the present invention, comprising an image processing unit 21 which processes and outputs an input NTSC or DTV image according to a display clock, and outputs a display sync according to the display clock; a NTSC PWM generating unit 22 which generates a PWM signal to lock a NTSC signal in accordance with both a display sync output from the image processing unit 21 and a NTSC field sync or vertical sync of an input NTSC image; a system time clock generating unit 23 which generates a STC by feeding back a reference clock; a DTV PWM generating unit 24 which generates a PWM signal to lock a DTV signal in accordance with the STC and a PCR signal input through a bit stream; a MUX 25 which selects a PWM signal generated from either the NTSC PWM generating unit 22 or the DTV PWM generating unit 24; a LPF 26 which low-pass-filters the PWM signal selected by the MUX 25 and outputs an analog level signal; a VCXO 27 which outputs a reference clock by varying an output frequency corresponding to the analog level signal low-pass-filtered through the LPF 26; and a PLL 28 which generates a display clock to compensate a sync of an output image signal to coincide with a sync of an input image signal, in accordance with the reference clock varied by the VCXO 27.

The operation of a sync signal correcting apparatus in a digital TV according to the second embodiment of the present invention will next be explained with reference to the accompanying drawings.

Referring to FIG. 2, the image processing unit 21 processes the NTSC image which is input when a digital TV mode is set to a NTSC display mode. The image processing unit 21 then outputs an image according to a display clock and outputs a display sync according to the display clock. At this time, the PLL 28 provides a display clock according to a default reference clock to the image processing unit 21.

As in the first embodiment, the NTSC PWM generating unit 22 generates a PWM signal to lock a NTSC signal in accordance with both the display sync output from the image processing unit 21 and a NTSC field sync or vertical sync of an input NTSC image. Particularly, if the period of the display sync from the image processing unit 21 is relatively equal to the period of the NTSC field/vertical sync of the NTSC image, the NTSC PWM generating unit 22 outputs the NTSC PWM signal with an unmodified duty factor to lock the NTSC signal. If the period of the display sync is shorter than the period of the NTSC field/vertical sync, the NTSC PWM generating unit 22 outputs a NTSC PWM signal with a smaller duty factor than a current duty factor to lock the NTSC signal while if the period of the display sync is longer than the period of the NTSC field/vertical sync, the NTSC PWM generating unit 22 outputs a NTSC PWM signal with a larger duty factor than a current duty factor to lock the NTSC signal. Here also, the smaller duty factor may be 50% smaller and the larger duty factor may be 50% larger.

In addition, however, the second embodiment includes the system time clock generating unit 23 which generates a STC by feeding back the reference clock from the VCXO 27. The DTV PWM generating unit 24 then generates a PWM signal to lock a DTV signal in accordance with both the STC from the system time clock generating unit 23 and a PCR signal input through the bit stream.

Thus, the MUX 25 selects a PWM signal generated from either the NTSC PWM generating unit 22 or the PWM signal generated from the DTV PWM generating unit 24, depending upon the display mode signal and outputs the selected PWM signal.

Accordingly, the LPF 26 low-pass-filters the PWM signal from the MUX 25 and outputs an analog level signal. The VCXO 27 then outputs a reference clock by varying the output frequency to correspond with the analog level signal, low-pass-filtered by the LPF 26. Here, the VCXO 27 has a frequency variation range of about −500 ppm~+500 ppm, centering around the reference frequency, to lock the display sync with the input NTSC field/vertical sync. Thus, a stable image can be output.

The PLL 28 then generates and outputs to the image processing unit 21 the display clock to compensate the sync of the output image signal to coincide with the sync of the input signal, in accordance with the reference clock varied by the VCXO 27. The PLL 28 generates t he display clock in units of a frame or a field such that an image jitter due to a frequency variation of the clock can be prevented. Also, if or when the sync/frequency of the output image signal coincides with the sync/frequency of the input image signal, the VCXO 27 directly outputs the output reference clock, without further processing, to the image processing unit as the display clock, thereby skipping the PLL 28.

As a result, the image processing unit 21 outputs the processed NTSC image or DTV image according to the display clock output from the PLL 28 or the VCXO 28, respectively, such that the output image can be synchronized with the input image.

Figure 3:
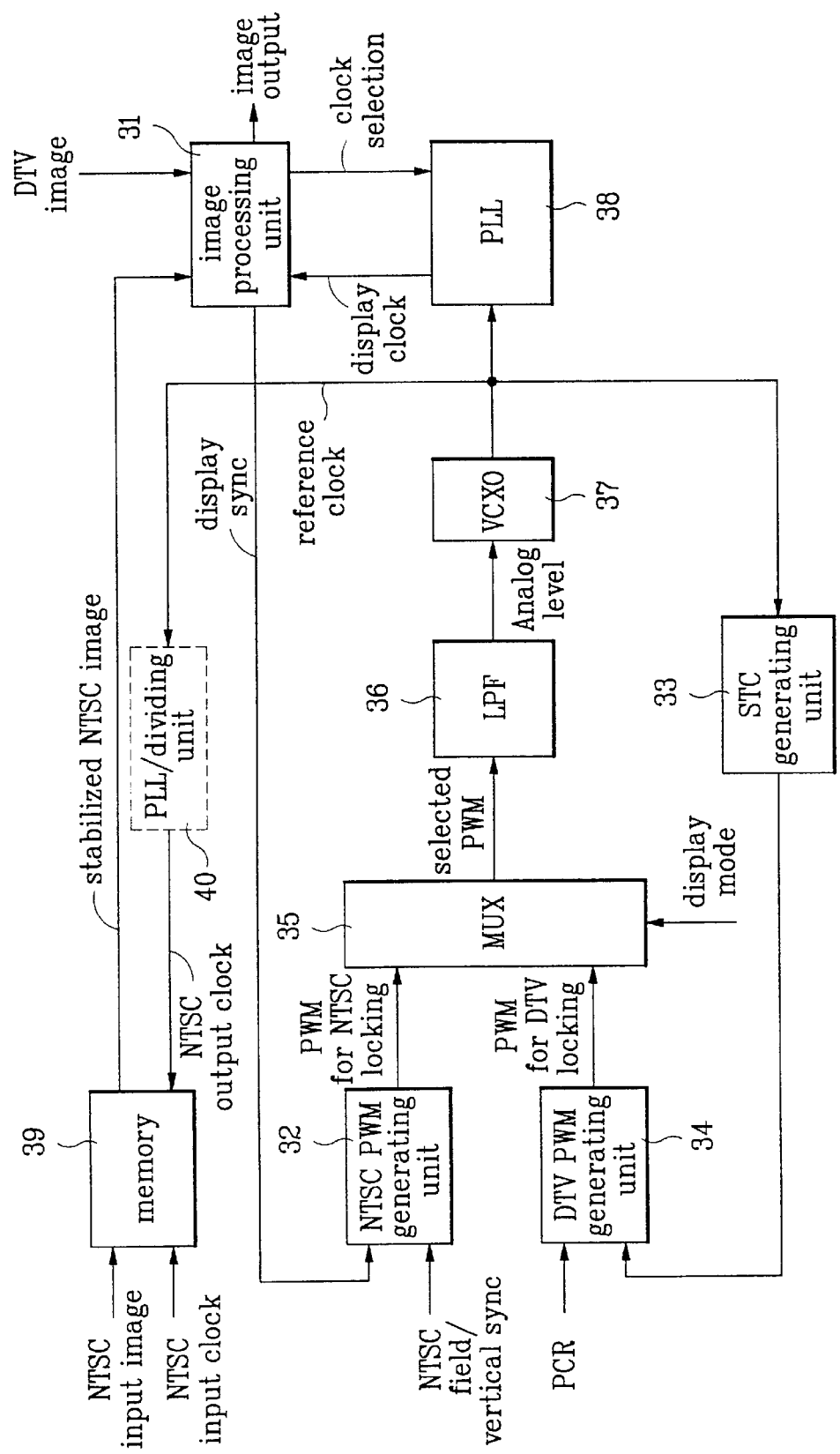
FIG. 3 is a block diagram of a sync signal correcting apparatus in a digital TV according to still another embodiment of the present invention.

FIG. 3 is still another block diagram of a sync signal correcting apparatus in a digital TV according to the present invention, comprising an image processing unit 31 which processes and outputs an input NTSC or DTV image according to a display clock, and outputs a display sync according to the display clock; a NTSC PWM generating unit 32 which generates a PWM signal to lock a NTSC signal in accordance with both a display sync output from the image processing unit 31 and a NTSC field sync or vertical sync of an input NTSC image; a system time clock generating unit 33 which generating a STC by feeding back a reference clock; a DTV PWM generating unit 34 which generates a PWM signal to lock a DTV signal in accordance with the STC and a PCR signal input through a bit stream; a MUX 35 which selects a PWM signal generated from either the NTSC PWM generating unit 32 or the DTV PWM generating unit 34 according to a display mode signal; a LPF 36 which low-pass-filters the PWM signal selected by the MUX 35 and outputs an analog level signal; a VCXO 37 which outputs a reference clock by varying an output frequency corresponding to the analog level signal low-pass-filtered through the LPF 36; a PLL 38 which generates a display clock to compensate a sync of an output image signal to coincide with a sync of an input image signal in accordance with the reference clock varied by the VCXO 37; a memory 39 which stores the NTSC image using a NTSC output clock of a NTSC image; and a PLL/dividing unit 40 which changes a reference clock varied by the VCXO 37 into the NTSC output clock.

The operation of a sync signal correcting apparatus in a digital TV according to the third embodiment of the present invention will next be explained with reference to the accompanying drawings.

Referring to FIG. 3, the image processing unit 31 processes the NTSC image which is input when a digital TV mode is set to a NTSC display mode. The image processing unit 31 then outputs an image according to a display clock and outputs a display sync according to the display clock. At this time, the PLL 38 provides a display clock according to a default reference clock to the image processing unit 31.

As in the second embodiment, the NTSC PWM generating unit 32 generates a PWM signal to lock a NTSC signal in accordance with both the display sync output from the image processing unit 31 and a NTSC field sync or vertical sync input of an input NTSC image. Particularly, if the period of the display sync from the image processing unit 31 is relatively equal to the period of the NTSC field/vertical sync input through the bit stream, the NTSC PWM generating unit 32 outputs the NTSC PWM signal with an unmodified duty factor to lock the NTSC signal. If the period of the display sync is shorter than the period of the NTSC field/vertical sync, the NTSC PWM generating unit 32 outputs a NTSC PWM signal with a smaller duty factor than a current duty factor to lock the NTSC signal while if the period of the display sync is longer than the period of the NTSC field/vertical sync, the NTSC PWM generating unit 32 outputs a NTSC PWM signal with a larger duty factor than a current duty factor to lock the NTSC signal. Here, the smaller duty factor may be 50% smaller and the larger duty factor may be 50% larger.

Also, the system time clock generating unit 33 generates a STC by feeding back the reference clock from the VCXO 37. The DTV PWM generating unit 34 then generates a PWM signal to lock a DTV signal in accordance with both the STC from the system time clock generating unit 33 and a PCR signal input through the bit stream. Thus, the MUX 35 selects a PWM signal generated from either the NTSC PWM generating unit 32 or the PWM signal generated from the DTV PWM generating unit 34, depending upon the display mode signal and outputs the selected PWM signal.

Accordingly, the LPF 36 low-pass-filters the PWM signal from the MUX 35 and outputs an analog level signal. The VCXO 37 then outputs a reference clock by varying the output frequency to correspond with the analog level signal, low-pass-filtered by the LPF 36. Here, the VCXO 37 has a frequency variation range of about −500 ppm~+500 ppm, centering around the reference frequency, to lock the display sync with the input NTSC field/vertical sync. Thus, a stable image can be output.

The PLL 38 then generates and outputs to the image processing unit 31 the display clock to compensate the sync of the output image signal to coincide with the sync of the input signal, in accordance with the reference clock varied by the VCXO 37. The PLL 38 generates the display clock in units of a frame or a field such that an image jitter due to a frequency variation of the clock can be prevented. Also, if or when the sync/frequency of the output image signal coincides with the sync/frequency of the input image signal, the VCXO 37 directly outputs the reference clock, without further processing, to the image processing unit as the display clock, thereby skipping the PLL 38.

The third embodiment, however, further includes the memory 39 which stores a NTSC image using a clock of a NTSC image, namely the NTSC output clock. Namely, the PLL/dividing unit 40 modifies the reference clock varied by the VCXO 37 and outputs the NTSC output clock to the memory 39. The VCXO 37 directly outputs the reference clock to the memory 39 as the NTSC output clock, if the sync/frequency of the output image signal coincides with the sync/frequency of the input image signal. The memory 39 then outputs a stabilized NTSC image to the image processing unit 31, in accordance with the NTSC output clock from the PLL/dividing unit 40.

As a result, the image processing unit processes and outputs a NTSC image from the memory 39 according to the display clock from the PLL 38, such that the output NTSC image can be synchronized with the input NTSC image.

Therefore, the present invention compensates the difference between an input sync and a display sync which may be generated during a digital processing of an input analog image signal, thereby allowing a display of better quality to viewers.

For example, in a typical VCR, the display sync can generally be locked during a play mode. On the other hands, in a fast forward (FF) or rewind mode, the frequency variation of the display sync often extends outside of the control range and the display sync cannot be locked. However, since the image itself shakes severely during a FF or rewind mode, the effects of a failure to lock the display sync would relatively be insignificant.

If a locking cannot be achieved, a skip or a repetition of an image would be generated in accordance with a difference between the sync of the input image signal and the sync of the output image signal. In such case, a motion of an image may be unpleasant to a viewer for a motion video. However, even if locking failure occurs, the present invention minimizes the frequency of the locking failures.

Furthermore, if a main picture is displayed simultaneously with a sub-picture such as a picture-in-picture (PIP) picture, a locking of the sub-picture cannot be achieved. Thus, the main picture is locked while a skip or a repetition of an image is generated for the sub-picture. If only the sub-picture is displayed, a stable image can be obtained by locking the sub-picture.

Accordingly, the present invention allows a user to view a better display by gradually compensating the difference between an input sync and a display sync which may be generated during a digital processing of an input analog image signal.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A sync signal correcting apparatus for DTV having an image processing unit, comprising:
   a NTSC PWM generating unit which generates a NTSC PWM signal to lock a NTSC signal in accordance with both a display sync of an image signal output from the image processing unit and an input sync of an input NTSC image signal, said NTSC PWM generating unit outputting the NTSC PWM signal as a PWM signal; and
   a sync signal correcting unit which outputs a display clock to the image processing unit to compensate the display sync to synchronize with the input sync, where the display clock is generated according to a reference clock varied based upon the PWM signal.

2. A sync signal correcting apparatus for DTV having an image processing unit, comprising:
   a NTSC PWM generating unit which generates a NTSC PWM signal to lock a NTSC signal in accordance with both a display sync of an image signal output from the image processing unit and an input sync of an input NTSC image signal, said NTSC PWM generating unit outputting the NTSC PWM signal as a PWM signal; and
   a sync signal correcting unit which generates a display clock to compensate the display sync to synchronize with the input sync, where the display clock is generated according to a reference clock varied based upon the PWM signal,
   wherein the NTSC PWM generating unit outputs the PWM signal with an unmodified duty factor if a period of the display sync is relatively equal to the period of the input sync, outputs a PWM signal with a smaller duty factor than a current duty factor if the period of the display sync is shorter than the period of the input sync, and outputs a PWM signal with a larger duty factor than a current duty factor if the period of the display sync is longer than the period of the input sync.

3. A sync signal correcting apparatus for DTV having an image processing unit, comprising:
   a NTSC PWM generating unit which generates a NTSC PWM signal to lock a NTSC signal in accordance with both a display sync of an image signal output from the image processing unit and an input sync of an input NTSC image signal, said NTSC PWM generating unit outputting the NTSC PWM signal as a PWM signal; and
   a sync signal correcting unit which generates a display clock to compensate the display sync to synchronize with the input sync, where the display clock is generated according to a reference clock varied based upon the PWM signal,
   wherein the sync signal correcting unit comprises:
      an LPF which low-pass filters the PWM signal from the NTSC PWM generating unit and outputs an analog level signal;
      a VCXO which outputs the reference clock by varying an output frequency corresponding to the analog level signal; and
      a PLL which generates the display clock in accordance with the reference clock.

4. An apparatus of claim 3, wherein the PLL generates the display clock in units of a frame or a field.

5. A sync signal correcting apparatus for DTV having an image processing unit, comprising:
- a NTSC PWM generating unit which generates a NTSC PWM signal to lock a NTSC signal in accordance with both a display sync of an image signal output from the image processing unit and an input sync of an input NTSC image signal, said NTSC PWM generating unit outputting the NTSC PWM signal as a PWM signal;
- a sync signal correcting unit which generates a display clock to compensate the display sync to synchronize with the input sync, where the display clock is generated according to a reference clock varied based upon the PWM signal,
- a system time clock generating unit which generates an STC by feeding back the reference clock;
- a DTV PWM generating unit which generates a DTV PWM signal to lock a DTV signal in accordance with both the STC and a PCR signal input through a bit stream, said DTV PWM generating unit outputting the DTV PWM signal as the PWM signal; and
- a MUX which selects and outputs the PWM from one of either the NTSC PWM generating unit or the DTV PWM generating unit, depending upon a display mode signal.

6. An apparatus of claim 5, wherein the sync signal correcting unit comprises:
- a LPF which low-pass-filters the PWM signal from the MUX and outputs an analog level signal;
- a VCXO which outputs the reference clock by varying an output frequency corresponding to the analog level signal; and
- a PLL which generates the display clock in accordance with the reference clock.

7. An apparatus of claim 6, wherein the PLL generates the display clock in units of a frame or a field.

8. An apparatus of claim 5, further comprising:
- a memory which stores a NTSC image using a NTSC output clock and outputting a stable NTSC image to the image processing unit; and
- a PLL/dividing unit which modifies the reference clock varied by the VCXO into the NTSC output clock.

9. A method for correcting a sync signal in a DTV having an image processing unit, comprising:
- (a1) generating an NTSC PWM signal to lock an NTSC signal in accordance with both a display sync of an image signal output from the image processing unit and an input sync of an image signal of an input NTSC image, and outputting the NTSC PWM as a PWM signal;
- (b1) outputting a display clock to the image processing unit to compensate for the display sync to synchronize with the input sync, where said display clock is generated according to a reference clock varied based upon the PWM signal.

10. A method for correcting a sync signal in a DTV having an image processing unit, comprising:
- (a1) generating an NTSC PWM signal to lock an NTSC signal in accordance with both a display sync of an image signal output from the image processing unit and an input sync of an image signal of an input NTSC image, and outputting the NTSC PWM as a PWM signal; and
- (b1) generating a display clock to compensate the display sync to synchronize with the input sync, where said display clock is generated according to a reference clock varied based upon the PWM signal,
wherein in step (a1), the PWM signal is output with an unmodified duty factor if a period of the display sync is relatively equal to a period of the input sync, with a smaller duty factor than a current duty factor if the period of the display sync is shorter than the period of the input sync, and with a larger duty factor than a current duty factor if the period of the display sync is longer than the period of the input sync.

11. A method for correcting a sync signal in a DTV having an image processing unit, comprising:
- (a1) generating an NTSC PWM signal to lock an NTSC signal in accordance with both a display sync of an image signal output from the image processing unit and an input sync of an image signal of an input NTSC image, and outputting the NTSC PWM as a PWM signal; and
- (b1) generating a display clock to compensate the display sync to synchronize with the input sync, where said display clock is generated according to a reference clock varied based upon the PWM signal,
wherein step (b1) further comprises:
  - (a2) low-pass filtering the PWM signal to output an analog level signal;
  - (b2) outputting the reference clock by varying an output frequency corresponding to the analog level signal; and
  - (c2) generating the display clock in accordance with the reference clock.

12. A method of claim 11, wherein in (c2), generating the display clock in units of a frame or a field.

13. A method for correcting a sync signal in a DTV having an image processing unit, comprising:
- (a1) generating an NTSC PWM signal to lock an NTSC signal in accordance with both a display sync of an image signal output from the image processing unit and an input sync of an image signal of an input NTSC image, and outputting the NTSC PWM as a PWM signal; and
- (b1) generating a display clock to compensate the display sync to synchronize with the input sync, where said display clock is generated according to a reference clock varied based upon the PWM signal,
- (c1) generating an STC by feeding back the reference clock;
- (d1) generating a DTV PWM signal to lock a DTV signal in accordance with both the STC and a PCR signal input through a bit stream, and outputting the DTV PWM as the PWM signal; and
- (e1) selecting and outputting the PWM from one of either (a1) or (d1) depending upon a display mode signal.

14. A method of claim 13, further comprising:
storing a NTSC image based on a NTSC output clock and outputting a stable NTSC image; and
modifying the reference clock into the NTSC output clock.

15. A digital television receiver having an image processing unit, comprising:
- a NTSC PWM generating unit which generates a NTSC PWM signal to lock a NTSC signal in accordance with both a display sync of an image signal output from the image processing unit and an input sync of a NTSC input image, said NTSC PWM generating unit outputting the NTSC PWM as a PWM signal;
- a LPF which low-pass-filters the PWM signal and outputs an analog level signal;

a VCXO which outputs a reference clock by varying an output frequency corresponding to the analog level signal; and a PLL which generates the display clock in accordance with the reference clock and outputs the display clock to the image processing unit.

16. An apparatus of claim 15, further comprising:

a system time clock generating unit which generates a STC by feeding back the reference clock;

a DTV PWM generating unit which generates a DTV PWM signal to lock a DTV signal in accordance with both the STC and a PCR signal input through a bit stream, said DTV PWM generating unit outputting the DTV PWM signal as the PWM signal; and a MUX which selects and outputs the PWM signal from one of either the NTSC PWM generating unit or the DTV PWM generating unit.

17. An apparatus of claim 16, further comprising:

a memory which stores a NTSC image based on a NTSC output clock and outputs a stable NTSC image; and a PLL/dividing unit which modifies the reference clock varied by the VCXO into the NTSC output clock.

* * * * *